United States Patent
Nittka et al.

(10) Patent No.: US 9,784,807 B2
(45) Date of Patent: Oct. 10, 2017

(54) METHOD AND MAGNETIC RESONANCE APPARATUS TO ACQUIRE MAGNETIC RESONANCE DATA OF A TARGET REGION INCLUDING A METAL OBJECT

(71) Applicant: Siemens Aktiengesellschaft, Munich (DE)

(72) Inventors: Mathias Nittka, Baiersdorf (DE); Theresa Bachschmidt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 750 days.

(21) Appl. No.: 14/321,833

(22) Filed: Jul. 2, 2014

(65) Prior Publication Data
US 2015/0008918 A1 Jan. 8, 2015

(30) Foreign Application Priority Data

Jul. 2, 2013 (DE) .................. 10 2013 212 894
Mar. 31, 2014 (DE) .................. 10 2014 206 011

(51) Int. Cl.
| | |
|---|---|
| *G01V 3/00* | (2006.01) |
| *G01R 33/36* | (2006.01) |
| *G01R 33/565* | (2006.01) |

(52) U.S. Cl.
CPC ..... *G01R 33/3678* (2013.01); *G01R 33/5659* (2013.01)

(58) Field of Classification Search
CPC .................................. G01R 33/3678
USPC .................................. 324/318, 322
See application file for complete search history.

(56) References Cited

U.S. PATENT DOCUMENTS

| | | | |
|---|---|---|---|
| 9,297,870 B2 | 3/2016 | Van Den Brink | |
| 9,389,294 B2* | 7/2016 | Sveinsson | ........ G01R 33/56563 |
| 9,488,709 B2* | 11/2016 | Den Harder | ........ G01R 33/445 |
| 2004/0164737 A1 | 8/2004 | Feiweier | |

(Continued)

FOREIGN PATENT DOCUMENTS

| | | |
|---|---|---|
| CN | 85101788 A | 1/1987 |
| JP | S62167554 A | 7/1987 |
| JP | 2005261924 A | 9/2005 |
| WO | WO-2013/109095 A1 | 7/2013 |

OTHER PUBLICATIONS

Lu et al., "SEMAC: Slice Encoding for Metal Artifact Correction in MRI" Magnetic Resonance in Medicine, vol. 62, pp. 66-76, (2009).

(Continued)

*Primary Examiner* — Louis Arana
(74) *Attorney, Agent, or Firm* — Schiff Hardin LLP

(57) ABSTRACT

In a method and magnetic resonance (MR) apparatus to acquire MR data of a target region that includes a metal object, an MR sequence that includes at least one radio-frequency excitation to be emitted via a radio-frequency coil arrangement is used. A radio-frequency coil arrangement having multiple coil elements that can be controlled independently with different amplitude and/or phase is used. The amplitudes and/or phases of the coil elements that describe the polarization of the radio-frequency field are selected to at least partially reduce artifacts arising in the metal object due to the radio-frequency excitation, in comparison to a homogeneous, circular polarization of the radio-frequency field of the radio-frequency field in the target region.

20 Claims, 2 Drawing Sheets

(56) References Cited

U.S. PATENT DOCUMENTS

| | | |
|---|---|---|
| 2005/0258832 A1 | 11/2005 | Eberlein et al. |
| 2006/0250133 A1 | 11/2006 | Krieg et al. |
| 2008/0186025 A1 | 8/2008 | Kasugai |
| 2009/0189609 A1 | 7/2009 | Eberler et al. |
| 2009/0309594 A1 | 12/2009 | Feiweier et al. |
| 2009/0322330 A1 | 12/2009 | Adachi et al. |
| 2010/0033179 A1 | 2/2010 | Hargreaves et al. |
| 2012/0179023 A1 | 7/2012 | Fuderer et al. |
| 2012/0306497 A1 | 12/2012 | Kaneko et al. |
| 2014/0210472 A1 | 7/2014 | Homann et al. |
| 2016/0084931 A1* | 3/2016 | Bachschmidt ... G01R 33/56563 324/309 |

OTHER PUBLICATIONS

Koch. et al., "A Multispectral Three-Dimensional Acquisition Technique for Imaging Near Metal Implants", Magnetic Resonance in Medicine, vol. 61, pp. 381-390, (2009).

Sutter et al., Reduction of Metal Artifacts in Patients with Total Hip Arthroplasty with Slice-encoding Metal Artifact Correction and View-Angle Tilting MR Imaging, Radiology, vol. 265, No. 1, pp. 204-214 (2012).

Hargreaves et al., "Metal-Induced Artifacts in MRI"; AJR; vol. 197; pp. 547-555; (2011).

Camacho et al, Nonsusceptibility Artifacts Due to Metallic Objects in MR Imaging; Journal of Magnetic Resonance Imaging; vol. 5; No. 1; pp. 75-88 (1995).

Koch et al., "B1 Effects when Imaging Near Metal Implants at 3T", Applied Science Laboratory, Proc. Intl. Soc. Mag. Reson. Med, vol. 18, p. 3082 (2010).

Sled et al., "Standing-Wave and RF Penetration Artifacts Caused by Elliptic Geometry: An Electrodynamic Analysis of MRI", IEEE Transactions on Medical Imaging, vol. 17, No. 4, pp. 653-662 (1998).

Tropp "Imaging brightening in samples of high dielectric constant", Journal of Magnetic Resonance, vol. 167, pp. 12-24, (2004).

Graf et al: "Effects on MRI due to altered rf polarization near conductive implants or instruments"; Medical Physics vol. 33 No. 1; pp. 124-127; (2006).

\* cited by examiner

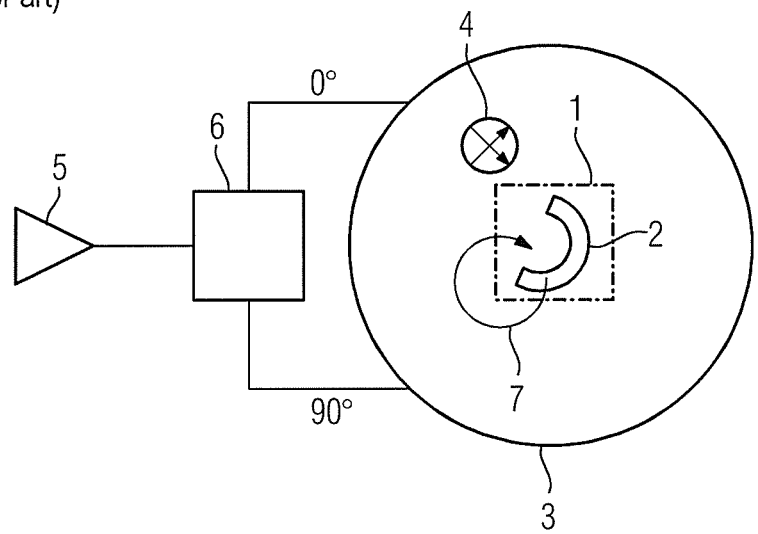
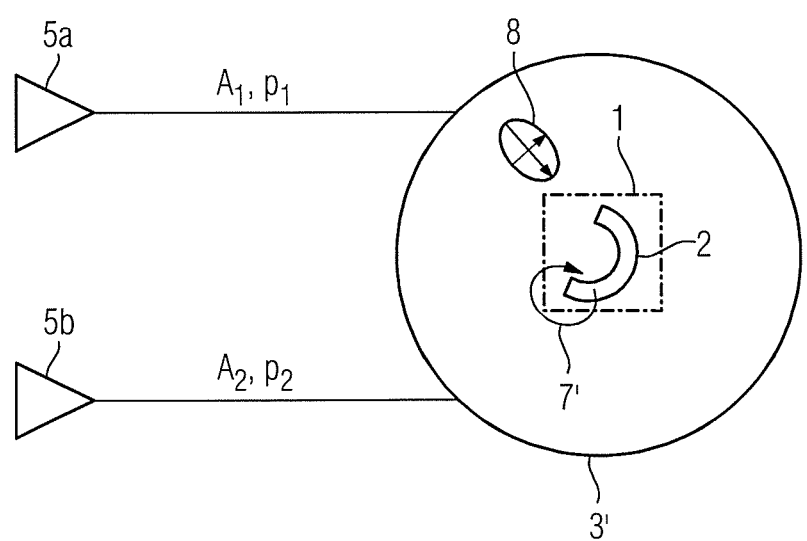

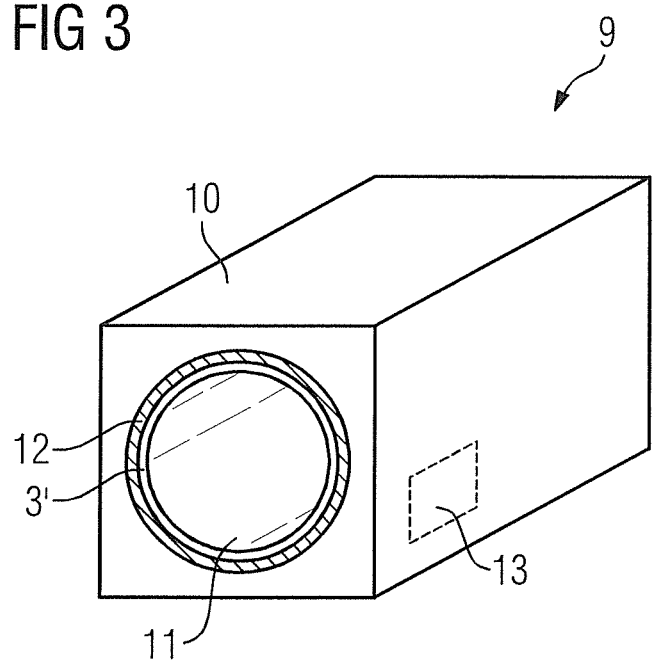

METHOD AND MAGNETIC RESONANCE APPARATUS TO ACQUIRE MAGNETIC RESONANCE DATA OF A TARGET REGION INCLUDING A METAL OBJECT

BACKGROUND OF THE INVENTION

Field of the Invention

The present invention concerns a method to acquire, with a magnetic resonance apparatus, magnetic resonance data of a target region including a metal object, wherein a magnetic resonance sequence including at least one radio-frequency excitation to be emitted via a radio-frequency coil arrangement is used. The invention also concerns a magnetic resonance apparatus for implementing such a method.

Description of the Prior Art

Magnetic resonance imaging is already widely known in the prior art. Radio-frequency excitations are thereby used in order to deflect spins in a basic magnetic field (B0 field) in order to be able to measure resulting signals from these. The radio-frequency field of the radio-frequency excitation is thereby most often designated as a B1 field.

Problems occur in magnetic resonance examinations when metallic objects are present, for example metallic implants in patients. In spite of these complications, the examination of patients with metallic implants has become an important application of magnetic resonance imaging. In particular, the increasing number of patients with orthopedic implants (for example screws, fixations, artificial joints, etc.) has led to the development of new techniques that are designed to reduce the significant image distortions due to the metal, since the high soft tissue contrast achieved with magnetic resonance imaging is superior to other imaging modalities. It should also be taken into account that other imaging modalities (for example computed tomography) also exhibit severe metal artifacts.

Magnetic resonance imaging is particularly appropriate to assist in treating post-operative complications since infections, rejection reactions and/or bone fractures can be markedly better diagnosed using magnetic resonance imaging, compared to other imaging modalities.

In magnetic resonance imaging, when a metallic object is present in the target region, the image artifacts are predominantly caused by the distortion or disturbance of the static basic magnetic field (B0 field), which is due to the high difference of the magnetic susceptibility of body tissue and metal. Additional basic known effects are the interference with dynamic magnetic fields (known as imaging gradients), for example due to eddy currents, as well as (as has recently been recognized) disruptions of the radio-frequency field due to induced radio-frequency currents in the metal object and in the surrounding tissue, for example.

Known procedures that target the reduction or correction of artifacts (in particular image distortions and contrast changes) due to metal objects have previously been implemented predominantly to address the severe distortions of the static B0 field near the metal objects. For example, it is known to use turbo spin echo sequences (TSE sequences) with a high bandwidth as the magnetic resonance sequence. Other approaches use a technique known as "view angle tilting" (distortion correction in the direction of the readout gradient). The distortion correction in the direction of the slice selection gradient—which is known under the keywords SEMAC/MAVRIC, see also in this regard the article by B. A. Hargreaves et al., "Metal-Induced Artifacts in MRI", AJR: 197, 2011, P. 547-555—is additionally known.

Although effects with regard to other sources—the gradient-induced and radio frequency-induced eddy currents as well as radio-frequency shadowing effects—are known in the prior art, the proposed solutions are less practical for clinical use. Reference is made in this regard to an article by C. R. Camacho et al., "Nonsusceptibility Artifacts Due to Metallic Objects in MR Imaging", JMRI: 5, 1995, P. 75-88. To solve this problem, it has been proposed to repeat the measurements multiple times with different transmitter voltages. However, this requires an unacceptable lengthening of the measurement times for the medical region. Alternatively, it has been proposed to use adiabatic pulses, but this requires long pulse lengths and high amplitudes, and therefore can only be used to a very limited extent.

SUMMARY OF THE INVENTION

An object of the present invention is to provide a method to reduce artifacts caused by the interaction of radio-frequency excitations with metal objects in an examination subject that achieves improved imaging results compared to the known techniques described above.

This object is achieved by a method of the aforementioned type wherein according to the invention, a radio-frequency coil arrangement is used that has multiple coil elements that can be controlled independently with different amplitude and/or phase, and wherein the amplitudes and/or phases of the coil elements that describe the polarization of the radio-frequency field are selected so as to at least partially reduce artifacts arising due to the radio-frequency excitation in the metal subject, in comparison to a circular polarization of the radio-frequency field that is homogeneous in the target region.

As has been explained, the problem underlying the invention is that radio-frequency currents are induced by the metallic object, and these radio-frequency currents are superimposed on the external transmission radio-frequency field, so that an effective total radio-frequency field develops locally. Depending on amplitude, phase and spatial alignment of the locally induced radio-frequency field relative to the externally acting radio-frequency field, contrast changes and shadows can occur in the image, to the point of signal obliteration (cancellation). The starting point of the present invention is the insight that the currents induced locally in the metal object (an implant, for example), or the surrounding tissue, are dependent on parameters of the external radio-frequency field, for example its polarization. In experiments, it has been established that the cited image artifacts can be avoided or at least attenuated by variation of the external radio-frequency field, in particular with regard to the polarization thereof. The ability to vary the radio-frequency field is achieved by the use of a radio-frequency coil arrangement that has coil elements that can be controlled independently via multiple channels. Such radio-frequency coil arrangements are also designated as multichannel transmission systems ("parallel transmit" systems). Multiple transmission channels are consequently present at which a radio-frequency signal can be applied with different amplitudes and relative phases.

A circularly polarized transmission radio-frequency field is typically used, but the desired imaging result can also be achieved with other amplitudes and relative phases for the different coil elements. This means that a variation range for the amplitudes and relative phases results in which a reduction of artifacts can be enabled without noteworthy limitation of the imaging result. Within the scope of the present invention, this variation range is used in order to identify amplitudes and relative phases that have as a result a reduced occurrence of artifacts, or even the result of an optimization process.

The external transmission radio-frequency field at the magnetic resonance apparatus is thus varied with multiple coil elements so that image artifacts are suppressed in target regions with metal objects, in particular at patients with metal implants. Conventionally, this radio-frequency field is circularly polarized, which means that crossed transmission channels with the same amplitude and a relative phase of 90° are used in order to achieve the goal of an optimally homogeneous radio-frequency excitation. A deviation from this homogeneous, circular polarization of the radio-frequency field is now made in order to reduce artifacts so that a better diagnostic image quality results, in particular at implant patients, since signal shadows near the implant can be avoided.

Given a two-channel system (i.e., a radio-frequency coil arrangement) that has two independently controllable coil elements, a transition can be made away from the circular polarization to an elliptical polarization, for example. Systems with more than two transmission channels also allow spatially varying polarizations to be achieved. Experiments on phantoms and in vivo have shown that metal artifacts near an implant (or metal object in general) can be significantly reduced with the described method.

It should be noted that it is appropriate to simultaneously take into account artifacts triggered by other effects in connection with metal objects. For example, the magnetic resonance sequence can be a turbo spin echo sequence, since artifacts that stem from the distortion of the B0 field can be largely avoided with such a sequence.

Various procedures are conceivable for determining amplitudes and/or phases that are suitable to reduce metal artifacts due to the radio-frequency excitation. For example, the amplitudes and/or phases can be determined by a calculation and/or depending on measurement data and/or within the scope of an optimization process. All of these approaches can be combined if—as will be presented in more detail—calculations (in particular simulations) can be used in a model for an optimization process whose result can be refined by measurements.

For example, calibration data can be acquired with the magnetic resonance data for an additional metal object, which coincide in at least one metal object parameter describing the metal object in the target region, and the calibration data are taken into account in the determination of the amplitudes and/or phases. It is thus possible to determine suitable parameters (thus amplitudes and relative phases) in advance experiments so that, for example, parameters can be determined for different implant types as metal objects, which parameters are then used again for corresponding implant types. It is thus possible to implement measurements for different object parameters, which measurements can be used again when metal objects of the same parameters should be used in the acquisition of magnetic resonance data if suitable amplitudes and phases from these are known. It is noted that calibration data can also be acquired under consideration of additional parameters, for example for different body regions (thus different parameters describing the body region) and the like.

It is also additionally or alternatively possible to implement a simulation of the acquisition of magnetic resonance data in order to calculate the amplitudes and phases. Simulation techniques are widely known in the field of magnetic resonance, and enable field distributions to be calculated, in particular the B1 field distribution of the radio-frequency field. A model of the target region can be used in order to implement calculations regarding processes generating artifacts.

In general, within the scope of the present invention it is appropriate for an optimization process to be implemented. In such a process, a permissible variation range for the amplitudes and/or phases is defined within the optimization process, starting from a basic setting describing in particular a homogeneous, circular polarization of the radio-frequency field, which is defined by a minimum desired image quality of the magnetic resonance data. A range (the variation range) is consequently provided from which the amplitude and phase cannot depart. The cost function of the optimization process can thereby be designed for an optimally extensive reduction of artifacts. The method can be used both in connection with calculations and in connection with measurements, for example with new parameters for a simulation are provided and/or new parameters for an additional measurement being determined via the optimization. In this way it is possible to determine amplitudes and/or phases optimized to be as low-cost as possible for special magnetic resonance data acquisition processes.

As already noted, the use of a model is particularly advantageous within the scope of a simulation calculation. In such a model, results can be calculated that are useful for one step of an optimization process, such that (generally speaking) it can be provided that an optimization process is conducted using a model of the target region with the metal object in the magnetic resonance device. An exemplary description is consequently determined that can in particular describe the susceptibility differences between the metal object and the environment (of tissue, for example), wherein the action of the magnetic resonance device (in particular the radio-frequency excitation) should likewise additionally be part of the model so that a model parameter can be the position of the metal object within the magnetic resonance device (or, more specifically, the homogeneity volume thereof).

In an embodiment of the invention, in the model, the metal object is assumed as a homogeneous model object having a geometric shape (in particular designed as a round or polygonal rod and/or sphere and/or ellipsoid) within an infinitely long cylinder or ellipsoid that is filled with a fluid (in particular water). Thus an infinitely long cylinder filled with fluid (preferably water) is assumed, but alternatively an ellipsoid can be determined. The cylinder or ellipsoid is a model mapping of a patient to be examined. A model object that describes the metal object and is assumed to be homogeneous is now located in this cylinder or ellipsoid. For example, the model object can describe a metal rod with defined length and defined diameter; alternatives are a specification as a sphere or ellipsoid. In this context, to simplify the model, no interaction is assumed between the model object and the fluid, which means that any interaction of the model object with the fluid surrounding it is ignored and not considered further within the scope of the model assumption.

For such models that operate with simple geometric shapes of the metal object and of the surrounding patient, analytical solutions for the calculation of fields are known that can be used within the scope of the optimization process for different polarizations. However, it is naturally also possible to map the model object more precisely (or even exactly) in terms of its geometric shape. For this case, numerical simulation techniques can be used in order to implement calculations in the model. The geometric shape of the metal object is used as a geometric shape of the model object, and calculations in the model take place in the form of a numerical simulation.

In each case, the model also includes a connection to the magnetic resonance device itself so that the radio-frequency excitation described by the variable polarization within the scope of the optimization process can be taken into account in the model. Results describing the resulting fields can thus be described for different polarizations that are described by amplitudes and/or phases, which results can in turn be input into a target function of the optimization process.

In order to achieve a model mapping the actual relationships as exactly as possible, it can be provided that at least one model parameter (in particular the position of the patient in the magnetic resonance device and/or the position of the metal object in the patient) is determined from data of a preparation measurement with the magnetic resonance device. In this embodiment, the optimization is consequently implemented individual to the patient, wherein important model parameters—for example the spatial position of the metal object (an implant, for example) in the patient and the position of the patient in the magnetic resonance device—are determined via preparation measurements. It is noted that it is alternatively possible to implement the optimization once for typical clinical scenarios (for example "artificial hip joint of type X left") and to store the parameters (as has already been indicated) in the magnetic resonance device, for example in the form of a look-up table, so that no adaptations individual to the patient must be made. A time savings can possibly be achieved in this way.

There are various possibilities of approaching the specific optimization in the optimization process. In this regard, it is noted that an electric field is associated with the radio-frequency field (B1 field). The higher the amplitude of the electric field in the region of the metal object, the higher the current induced therein as well, and consequently the greater the radio-frequency interference field that is thereby induced, which superimposes with the external radio-frequency field of the radio-frequency excitation and leads to the described imaging disruptions in the environment of the metal object. A first optimization criterion for artifact reduction can be derived from this observation.

Consequently, in an embodiment of the invention, as an optimization goal, an electric field in the region of the model that is populated by the metal object should be as weak as possible for a radio-frequency excitation having polarization described by test parameters. It is noted that the electric field is naturally also radio-frequency; nevertheless, in the following the B1 field continues to be designated as a radio-frequency field, as was introduced previously. Within the scope of such an optimization goal (which, as known, can be described by a target function), a polarization of the radio-frequency excitation should consequently be determined for which the electric field at the metal object is zero, such that the induction of currents and interference fields resulting from this should optimally be avoided. However, the homogeneity of the effective (magnetic B1) radio-frequency field can alternatively or additionally be considered, at least in the region of the metal object; it can consequently be provided that an optimally homogeneous total radio-frequency magnetic field of a radio-frequency excitation having polarization described by test parameters should be achieved as an optimization goal in a region (in particular the target region) adjacent to the metal object. In order to assess the effective complete (B1) radio-frequency field (which consequently includes the contributions of the radio-frequency excitation itself and also the interference fields arising due to induction), at least one region adjacent to the metal object (consequently the model object in the model) is considered, which does not necessarily need to include the entire target region. However, it can also be appropriate to realize an optimally high homogeneity of the resulting magnetic radio-frequency field in the entire target region.

The optimization procedure does not depend on the strength of the radio-frequency field in the region (in particular the target region), since this can be adjusted via corresponding parameters of the radio-frequency excitation, in particular the transmitter voltage (consequently the reference voltage in the generation of the radio-frequency excitation).

In a preferred embodiment of the invention, a test measurement of a (B1) radio-frequency field map is implemented after the determination of the amplitudes and/or phases in the optimization process, and that the amplitudes and/or phases are adapted depending on the radio-frequency field map, which describes the magnetic radio-frequency field. It is thus possible to measure such a radio-frequency field map (also called a B1 map) with a radio-frequency excitation of the polarization that is a result of the optimization process, in order to determine deviations of the model calculation from reality, and therefore to more precisely establish the amplitudes and/or phases that describe the polarization. In a further embodiment, the measurement result is used to improve the model and/or an additional optimization process is implemented within the scope of the test measurements; after an adaptation of the polarization, a test measurement is consequently implemented again with the new polarization until specific quality criteria are achieved.

As already noted, it is advantageous for an adaptation of the transmitter voltage toward a designed value to take place depending on the most recent strength of the radio-frequency field that is measured by the radio-frequency field map. A transmitter adjustment can consequently take place—preferably based on the radio-frequency field map (B1 map)—so that the radio-frequency field resulting in total for the acquisition of the magnetic resonance data is not too high or too low. This is typically the last method step before the image acquisition takes place with the optimized amplitudes and/or phases (thus the optimized polarization).

The method described above is usable in a clinical routine with which significant image artifacts due to radio-frequency field distortions can be reduced, as occur particularly in the presence of larger metal objects (for example implants such as replacement hip joints).

In another preferred embodiment, the amplitudes and/or phases are retrieved from a look-up table before the acquisition of the magnetic resonance data, depending on at least one object parameter that describes the metal object. For example, the results of the calculations just described and/or measurements of calibration data can be stored in such a look-up table, wherein—upon every acquisition of magnetic resonance data for a defined target region—data sets coinciding with a defined metal object with the object parameters describing the current acquisition plan are sought, and the corresponding amplitudes and/or phases are used. Naturally, the look-up table can additionally be determined depending on other parameters, for example parameters describing the target region (body region, for example), the acquisition goal (sought diagnosis), the specific magnetic resonance sequence that is used, and the like. In this way, suitable phases and/or amplitudes exist for all standardizable acquisition processes.

As an alternative to the use of a look-up table, it is also possible to implement an adjustment measurement is implemented before the acquisition of the magnetic resonance data for at least two parameter sets of amplitudes and/or phases, and the amplitudes and/or phases are selected depending on the result of the adjustment measurement. This means that an additional adjustment measurement that automatically determines the optimal parameters can be implemented before the actual, diagnostic measurement (thus the acquisition of the magnetic resonance data). Measurements that can be implemented quickly are preferred, such that the adjustment measurement can be a projection measurement, which (as is known) can be implemented extremely quickly. For example, an evaluation of the adjustment measurements can be likewise be implemented extremely quickly by evaluation of image brightness and the like. Moreover, here as well, an optimization process can take place in which the amplitudes and phases of a subsequent adjustment measurement that are used can be dependent on the results of preceding adjustment measurements.

The induced radio-frequency field in the surroundings of the metal object can be very inhomogeneous, such that it is also possible that the artifacts cannot be completely avoided by modified amplitudes and/or phases but their intensity and/or spatial position can be altered. In this case as well, a stronger reduction of artifacts is possible in the method according to the invention because data subsets of the magnetic resonance data can be respectively acquired in at least two acquisition processes. Such data subsets have reduced artifacts in different sub-regions of the overall target region, and a combination of the data subsets takes place under consideration of the sub-regions in a further processing of the magnetic resonance data. The measurement is consequently repeated with different transmission parameters in order to be able to cover a larger region of the image overall with reduced artifacts. The combination of the data subsets can take place by a sum-of-squares addition of the individual images that respectively result from the data subsets, but combination methods taking into account more complicated individual circumstances are also conceivable. It is thus possible to detect artifacts that may remain in the data subsets (for example using artifact detection algorithms), from which weighting factors (for example) can be determined that are taken into account in the combination of the data subsets.

In addition to the method, the invention also concerns a magnetic resonance apparatus having a control device designed to implement the method according to the invention. All statements with regard to the method according to the invention can apply to the magnetic resonance apparatus according to the invention, such that the aforementioned advantages of the present invention can also be achieved by this apparatus.

BRIEF DESCRIPTION OF THE DRAWINGS

FIG. 1 illustrates the acquisition of MR data from a target region that contains a metal object according to the prior art.

FIG. 2 illustrates, in a diagram corresponding to FIG. 1, the acquisition of MR data from a target region containing a metal object, with the method according to the invention.

FIG. 3 schematically illustrates a magnetic resonance apparatus according to the invention.

DESCRIPTION OF THE PREFERRED EMBODIMENTS

FIG. 1 explains the prior art from which the present invention proceeds. Magnetic resonance (MR) data are to be acquired from a target region 1 in which a metal object 2 (an implant, for example) is present, using a magnetic resonance apparatus (here only portions of the radio-frequency transmission system thereof are shown). For acquisition of magnetic resonance data, it is known to control a radio-frequency coil arrangement 3 so that—at least in the target area 1—a homogeneous, circular polarization of the resulting radio-frequency field, with which the radio-frequency excitation should take place, is created, as indicated by the symbol 4. A circularly polarized B1 field thus exists in the target region 1. This is achieved by the radio-frequency signal generated by an amplifier device 5 being divided via a 90° hybrid device 6, and passed to the radio-frequency coil arrangement 3. Due to this radio-frequency field, induced radio-frequency currents occur within the metal object 2 that, in turn, result in radio-frequency fields 7 that cause artifacts (signal shadows, for example) in the acquired magnetic resonance data. Such artifacts generated by the radio-frequency field (B1 field) should be reduced by the method according to the invention.

The present invention is based on the insight that the radio-frequency field can be modified (in particular with regard to its polarization) so that an essentially identical imaging result is nevertheless achieved, but the artifacts are at least reduced due to the modified radio-frequency field. In accordance with the invention as shown in FIG. 2, a radio-frequency coil arrangement 3' is thus used that has multiple, independently controllable coil elements in which different amplitudes and phases can be selected (set) independently for the individual coil elements, so a variation range exists for the amplitudes and phases that can be utilized according to the invention in order to determine an artifact-reducing setting.

This is depicted in FIG. 2 as an example of a radio-frequency coil arrangement 3' with two transmission channels, wherein each transmission channel is controlled via a corresponding amplifier device 5a, 5b. The amplitude $A_1$ and the phase $P_1$ are used for the first transmission channel; the amplitude $A_2$ and the phase $P_2$ are used for the second transmission channel. The phases and amplitudes are now selected by a control device of the magnetic resonance device for the specific use case so that the artifacts are reduced. This is achieved by an elliptical polarization of the frequency field, as is indicated by the symbol 8. In this way, the induced radio-frequency currents in the metal object 2 are reduced so that reduced induced fields 7' also result, and overall a reduction of artifacts in the magnetic resonance data occurs.

The invention is naturally not limited to two transmission channels or two coil elements, but can also be used with radio-frequency coil arrangements 3' having a greater number of independently controllable transmission channels.

In a first exemplary embodiment of the method according to the invention, when MR data from a target region 1 should be acquired in which a metal object 2 (in particular an implant) is present, parameters describing the target region 1 (in particular the body region) and object parameters describing the metal object 2 are initially compiled. A turbo spin echo sequence is used as a magnetic resonance sequence in order to also largely avoid artifacts due to the disruption of the basic magnetic field (B0 field). Variations of this magnetic resonance sequence can be selectively used, with the sequence parameters that describe each variation being known in advance. All of these parameters can now be used in order to retrieve suitable amplitudes and phases for the current magnetic resonance data acquisition in a look-up table. The corresponding phases and amplitudes are then used to control the radio-frequency coil arrangement.

The data sets (which include phases and amplitudes for the different transmission channels and are associated with object parameters and/or target region parameters and/or sequence parameters and/or additional input parameters) can be determined in different ways, but preferably within the scope of an optimization process. Measurements to acquire calibration data are possible and calculations, in particular using simulations, can be alternatively or additionally implemented. Measurements of calibration data can take place in that conditions defined by a specific values of object parameters and possible additional input parameters (for example with the addition of a specific implant) are established, and calibration data are acquired for different values of amplitudes and phases for the channels. It is advantageous that here a form of an optimization process is already used as a basis, which means that amplitudes and phases that are to be used for the measurement of calibration data are determined next under consideration of the calibration data acquired in a preceding acquisition. The procedure can be the same for simulations. Given such optimization processes, and in general given the implementation of calibration measurements and/or simulations, attention must be paid to the variation range so that a defined image quality is maintained. Results of simulations or the calibration data are assessed with regard to the presence of artifacts, for example by determining values of a cost function, so that values for the amplitude and the relative phases can be obtained that are optimal, or at least improved with regard to artifacts.

As an alternative to the use of look-up tables, it is also possible to initially implement an adjustment measurement for at least two parameter sets of amplitudes and/or phases before the acquisition of the magnetic resonance data, wherein the adjustment data that are thereby measured are evaluated with regard to artifacts, and the amplitudes and/or phases are selected depending on the result of the adjustment measurements, wherein an optimization process can again be used. The adjustment measurements are then preferably measurements that can be implemented quickly, for example projection measurements. Shadow artifacts will appear in these projection measurements.

In a further embodiment of the invention, it is also possible to determine the most suitable polarization (consequently the optimal phases and/or amplitudes), individualized to the patient, through a sequence of an optimization process with calculations in a model and at least one test measurement. However, the procedure described in the following is naturally also suitable to determine data sets for the aforementioned look-up such tables.

In this approach, a model is used that describes the patient, the metal object 2 and the interaction with the magnetic resonance apparatus. Analytical calculations are possible using a simple geometric shape for the model object representing the metal object 2 in the model. If it is desired that the shape of the model object should correspond to the actual geometric shape of the metal object 2, a numerical simulation can be used for field calculations in the model.

As a specific example for explanation, a metal rod is considered as a model object in an infinitely long cylinder that is filled with water. An ellipsoid is also conceivable to describe the model of the patient. Background concerning analytical calculations in this regard, can be found in the articles by John G. Sled and G. Bruce Pike, "Standing-Wave and RF Penetration Artifacts Caused by Elliptic Geometry: An Electrodynamic Analysis of MRI", IEEE Transactions on Medical Imaging 17 (1998), P. 653-662, and by James Tropp, "Image brightening in samples of high dielectric constant", Journal of Magnetic Resonance 167 (2004), P. 12-24.

To complete the model, a preparation measurement is initially implemented in which the position of the metal object 2 in the patient and the position of the patient in the magnetic resonance device are determined. Corresponding measurement methods—for example the acquisition of localizers—are already sufficiently known in the prior art.

In the following, a radio-frequency coil arrangement 3' with two coil elements (thus two transmission channels) is again assumed, for example. A pair of linearly polarized radio-frequency fields $B_1^x$ and $B_1^y$ is generated along the x-axis and y-axis. The resulting vector potential A can be determined analytically in the cylinder (see the aforementioned article) and depends on the polarization of the two fields that yields the total polarization. $A_x$ is thereby induced by $B_1^x$, and $A_y$ is induced by $B_1^y$.

$$A^t = \text{real}(A \cdot e^{i\omega t}) \text{ with } A = A_x \cdot e^{id\phi} + A_y$$

The radio-frequency field undistorted by the model object then results as $$B = \text{rot } A^t$$

and the electrical field connected with this at the location r results as $$E(r) = i\omega/2 r \times B(r),$$

which, in the model object (formed here as a metal rod) of length $l_R$ at the position $p=(x_p, y_p)$, generates a current flow in the z-direction $$I_z \approx E_z(p) l_R/(i\omega L_R)$$

depending on its inductivity $L_R$. This in turn now induces the interference field $$B_x^{ind}(r) = -\frac{\mu_0}{2\pi} \frac{\sin(\Psi_r)}{r_p} I_z \text{ and}$$

$$B_y^{ind}(r) = \frac{\mu_0}{2\pi} \frac{\cos(\Psi_r)}{r_p} I_z,$$

wherein the angle $\Psi_r$ is defined as an azimuth of the metal rod, and $r_p$ designates the length between the considered point r and the metal rod at position p.

The total effective radio-frequency field (total radio-frequency field) in the object can consequently be described as $$B_1^{tot}(r) = (\partial_y + i\partial_x)A(r) + \frac{\mu_0 l_R}{4\pi L_R} \frac{\sin(\Psi_r) + i\cos(\Psi_r)}{r_p} (x_p \partial_x + y_p \partial_y)A(p).$$

An infinitely fast propagation speed is hereby assumed.

Different fields for different polarizations can now be determined with this, such that an optimization process can be realized. Two optimization goals are conceivable. The variation of the polarization can be used in the optimization method to set the electric field for all points belonging to the model object as close to zero as possible. Alternatively, the total radio-frequency field $B_1^{tot}$ can be required to be as homogenous as possible in a region (preferably the entire region) adjacent to the model object. The polarization of A is varied by variation of the amplitudes and/or phases.

The theory described here can naturally also be extended to radio-frequency coil arrangements with more than two transmission channels.

Within the scope of a test measurement, after conclusion of the optimization process the usability of the determined amplitudes and phases can in practice be checked, for which a radio-frequency field map is measured (B1 map) on the basis of which an additional adaptation of the amplitudes and/or phases—or even of the model—can take place with new optimization.

Particularly in cases in which an optimally low electrical field—or even an electrical field that is not present at all—is optimized in the region of the model object (but also otherwise), cases can occur in which the strength of the resulting total radio-frequency field (in particular determined within the scope of the test measurement) is too low or too high, which can be compensated via adaptation of the transmitter voltage so that the desired flip angle is achieved.

Within the scope of the method according to the invention, it is also possible to acquire multiple data subsets when a sufficient reduction of artifacts cannot be achieved from the data set for the totality of the target region 1. By acquiring respective data subsets that each represent only a sub-region of the overall target region 1, a sub-region-by-sub-region reduction or spatial shift of the artifacts occurs. For the acquisition of the multiple data subsets different parameter sets of amplitudes and phases are used so that complete and wide-ranging, artifact-reduced magnetic resonance data can be obtained by a combination of these data subsets or the respective sub-images resulting therefrom.

FIG. 3 shows a magnetic resonance device 9 according to the invention. As is basically known, this apparatus has a basic magnetic field unit 10 in which a cylindrical patient receptacle 11 is situated. A patient bed (not shown) is provided to move a patient into and out of the receptacle 11. Surrounding the patient receptacle 11 are a gradient coil arrangement 12 and a radio-frequency coil arrangement 3' with independently controllable RF coil elements.

The parameters (thus amplitudes and phases) with which the transmission channels of the radio-frequency coil arrangement 3' can be controlled can be selected by a control device 13 as described above, in order to reduce artifacts due to the radio-frequency inductions in the metal object 2, which means that the control device 13 is designed to implement the method according to the invention. A memory to store the look-up table (if used) can be provided, preferably within the control device 13.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) data from a target region of an examination subject, which includes a metal object, comprising:
    operating an MR data acquisition unit, which comprises multiple, individually controllable radio-frequency (RF) coil elements, in which an examination subject is situated, said examination subject comprising a target region that contains a metal object, to acquire MR data from the target region using a magnetic resonance sequence that comprises at least one RF excitation of nuclear spins in the target region;
    in said MR sequence, radiating RF signals respectively from said multiple RF coils elements with respectively different amplitudes and/or phases, and setting the respectively different amplitudes and/or phases to produce a non-circular polarization of an RF field in said target region that reduces locally induced RF currents in said metal object due to said RF field, in comparison to RF currents induced by a homogenous, circular polarization of said RF field in said target region; and
    providing MR data acquired from the target region in said MR sequence to a processor and, in said processor, reconstructing an image of the target region from the MR data, said MR image comprising reduced image artifacts as a result of the reduced induced currents, and making said MR image available as a data file at an output of said processor.

2. A method as claimed in claim 1 comprising operating said MR data acquisition unit with a turbo spin echo sequence as said MR sequence.

3. A method as claimed in claim 1 comprising, prior to acquiring said MR data by operating said MR data acquisition unit with said MR sequence, operating said MR data acquisition unit to acquire MR calibration data from an additional metal object, which coincides with said metal object in said target region, that represent a parameter that describes said metal object, and, in said processor, using said calibration data to determine said amplitudes and/or said phases.

4. A method as claimed in claim 3 comprising, in said processor, using said calibration data to calculate a simulation of operation of said MR data acquisition unit according to said MR sequence to acquire said MR data from said target region containing said metal object, and using said simulation to determine said amplitudes and/or phases.

5. A method as claimed in claim 1 comprising, in said processor, determining said amplitudes and/or said phases by implementing an optimization procedure that starts from an initial setting describing said homogenous, circular polarization of said RF field, and wherein said basic setting is successively modified until a predetermined image quality, corresponding to a degree of said artifacts in said image, is obtained.

6. A method as claimed in claim 5 comprising implementing said optimization procedure using a model of said target region with said metal object therein in said MR data acquisition unit.

7. A method as claimed in claim 6 comprising using, as said model, a model wherein the metal object is assumed as a homogenous model object having a geometric shape, selected from the group consisting of a round rod, a polygonal rod, a sphere, and an ellipsoid, within an infinitely long cylinder or ellipsoid filled with a fluid.

8. A method as claimed in claim 7 wherein said fluid is water.

9. A method as claimed in claim 6 comprising determining at least one model parameter of said model from data obtained by operating said MR data acquisition unit in a preparation measurement that precedes operation of said MR data acquisition unit with said MR sequence.

10. A method as claimed in claim 9 comprising, in said processor, determining, as said at least one model parameter, a position of a patient in the MR data acquisition unit, from said data acquired in said preparation measurement.

11. A method as claimed in claim 9 comprising, in said processor, determining, as said at least one model parameter, a position of the position of the metal object in the patient, from said data acquired in said preparation measurement.

12. A method as claimed in claim 6 comprising implementing said optimization procedure to identify said amplitudes and/or said phases that produce a polarization of said RF field that minimizes an electrical field in a region of said model, in which a model object representing said metal object, is situated.

13. A method as claimed in claim 6 comprising implementing said optimization procedure to determine said amplitudes and/or said phases that produce a polarization of said RF field that optimally homogenizes a totality of said RF field adjacent to a model object, that represents said metal object, in said model.

14. A method as claimed in claim 5 comprising operating said MR data acquisition unit to acquire an RF field map, and adapting initial values for said amplitudes and/or phases in said optimization procedure dependent on said RF field map.

15. A method as claimed in claim 14 comprising operating each of said multiple RF coils with a transmitter voltage that contributes to a field strength of said RF field, and adapting the respective transmitter voltages in said optimization procedure to determine said amplitudes and/or said phases that produce a predetermined field strength of said RF field.

16. A method as claimed in claim 1 comprising providing said processor with an input that describes a parameter of said metal object and, via said processor, retrieving said amplitudes and/or said phases from a look-up table as values for said amplitudes and/or said phases that are stored in said look-up table corresponding to said parameter.

17. A method as claimed in claim 1 comprising operating said MR data acquisition unit before operation of said MR data acquisition unit according to said MR sequence, in an adjustment measurement to acquire at least two parameter sets of said amplitudes and/or said phases, and setting said amplitudes and/or said phases in said MR sequence dependent on said at least two parameter sets.

18. A method as claimed in claim 17 comprising operating said MR data acquisition unit in a projection measurement, as said adjustment measurement.

19. A method as claimed in claim 1 comprising operating said MR data acquisition unit in at least two repetitions of said MR sequence and, in each of said repetitions, acquiring MR data only from a sub-region of said target region, and thereby obtaining at least two data subsets, and combining said at least two data subsets dependent on a degree of said artifacts respectively contained therein, in order to reconstruct said image of said target region.

20. A magnetic resonance apparatus comprising:
an MR data acquisition unit comprising multiple, individually controllable radio-frequency coil elements;
a control unit configured to operate the MR data acquisition unit, which comprises multiple, individually controllable radio-frequency (RF) coil elements, in which an examination subject is situated, said examination subject comprising a target region that contains a metal object, to acquire MR data from the target region using a magnetic resonance sequence that comprises at least one RF excitation of nuclear spins in the target region;
said control unit being configured to operate the MR data acquisition unit in said MR sequence to radiate RF signals respectively from said multiple RF coils elements with respectively different amplitudes and/or phases, and setting the respectively different amplitudes and/or phases to produce a non-circular polarization of an RF field in said target region that reduces locally induced RF currents in said metal object due to said RF field, in comparison to RF currents induced by a homogenous, circular polarization of said RF field in said target region; and
a processor provided with MR data acquired from the target region in said MR sequence, said processor being configured to reconstruct an image of the target region from the MR data, said MR image comprising reduced image artifacts as a result of the reduced induced currents, and to make said MR image available as a data file at an output of said processor.

* * * * *